US008472689B2

(12) United States Patent
Souza et al.

(10) Patent No.: US 8,472,689 B2
(45) Date of Patent: Jun. 25, 2013

(54) METHOD FOR ENHANCED VOXEL RESOLUTION IN MRI IMAGE

(75) Inventors: Andre Souza, Webster, NY (US); Robert Allen Senn, Pittsford, NY (US)

(73) Assignee: Carestream Health, Inc., Rochester, NY (US)

( * ) Notice: Subject to any disclaimer, the term of this patent is extended or adjusted under 35 U.S.C. 154(b) by 1062 days.

(21) Appl. No.: 12/180,692

(22) Filed: Jul. 28, 2008

(65) Prior Publication Data

US 2009/0226067 A1     Sep. 10, 2009

Related U.S. Application Data

(60) Provisional application No. 61/033,551, filed on Mar. 4, 2008.

(51) Int. Cl.
*G06K 9/32* (2006.01)
*A61B 5/055* (2006.01)

(52) U.S. Cl.
USPC .......................................... 382/131; 382/299

(58) Field of Classification Search
USPC ................. 382/128, 190, 302, 131, 132, 154, 382/293, 294, 299, 300; 600/410, 416; 128/920, 128/922; 345/419, 606
See application file for complete search history.

(56) References Cited

U.S. PATENT DOCUMENTS 6,998,841 B1   2/2006   Tamez-Pena et al.

OTHER PUBLICATIONS

National Electrical Manufacturers Association (NEMA) ed.: *Digital Imaging and Communications in Medicine (DICOM)* Part 3, PS 3.3 (2003), 855 pgs.
F. Maes, A. Collignon, D. Vandermeulen, G. Marchal and P. Suetens, "Multimodality image registration by maximization of mutual information" *IEEE Transactions on Medical Imaging* 16 2 (1997), pp. 187-198.
W.M. Wells, III, P. Viola, H. Atsumi, S. Nakajima and R. Kikinis, "Multimodal volume registration by maximization of mutual information" *Medical Image Analysis* 11 (1996), pp. 35-51.
S. Peled and Y. Yeshurun in "Superesolution in MRI—perhaps sometimes," *Magnetic Resonance in Medicine*, vol. 48, 2002, pp. 409.
M. Irani and S. Peleg in "Improving Resolution by Image Registration," *Graphical Models and Image Processing*, vol. 53, 1991, pp. 231-239.
Uros Vovk et al., "A Review of Methods for Correction of Intensity Inhomogeneity in MRI", IEEE Transactions on Medical Imaging, vol. 26, No. 3, Mar. 2007, pp. 405-421.
Eyal Carmi et al., "Resolution enhancement in MRI", Magnetic Resonance Imaging 24 (2006) pp. 133-154.

(Continued)

*Primary Examiner* — Clayton E LaBalle
*Assistant Examiner* — Leon W Rhodes, Jr.

(57) ABSTRACT

A method for providing an enhanced 3-D image for a volume imaging apparatus obtains 3-D volume images of an object at a first resolution and forms a 3-D matrix of voxels at a second, higher resolution. Two or more 3-D volume images that have different spatial orientations and that intersect at the voxel are registered. The voxel is mapped to the 3-D matrix. Inpainting fills in gap regions between mapped voxels in the 3-D matrix. A simulated first-resolution data value is generated according to one or more 3-D matrix values. The simulated first-resolution data value is compared with an observed first-resolution value from the 3-D volume images and, until the simulated first resolution data value is within a predetermined threshold value of the observed first-resolution value or until a predetermined number of iterations is reached, the 3-D matrix voxel values are adjusted and the simulated first-resolution data value recomputed.

8 Claims, 13 Drawing Sheets

OTHER PUBLICATIONS

Sandrerley R. Pires et al., "Interpolation of Computerized Tomography Slices Using 3D Digital Inpainting", Brazillian Symposium on Computer Graphics and Image Processing, 2006, IEEE Computer Society.

Richard Z. Shilling et al., "Merging Multiple Stacks MRI Into a Single Data Volume", Department of Electrical and Computer Engineering, Georgia Institute of Technology, Atlanta, Georgia, ISBI 2006 IEEE, pp. 1012-1015.

Andre Souza et al., "Model-Based Super-Resolution for MRI", $30^{th}$ Annual International IEEE EMBC Conference, Vancouver, British Columbia, Canada—Aug. 20-24, 2008, pp. 430-434.

Sharon Peled, et al., "Superresolution in MRI: Application to Human White Matter Fiber Tract Visualization by Diffusion Tensor Imaging," Magnetic Resonance in Medicine, No. 45, pp. 29-35, 2001, XP-000981008.

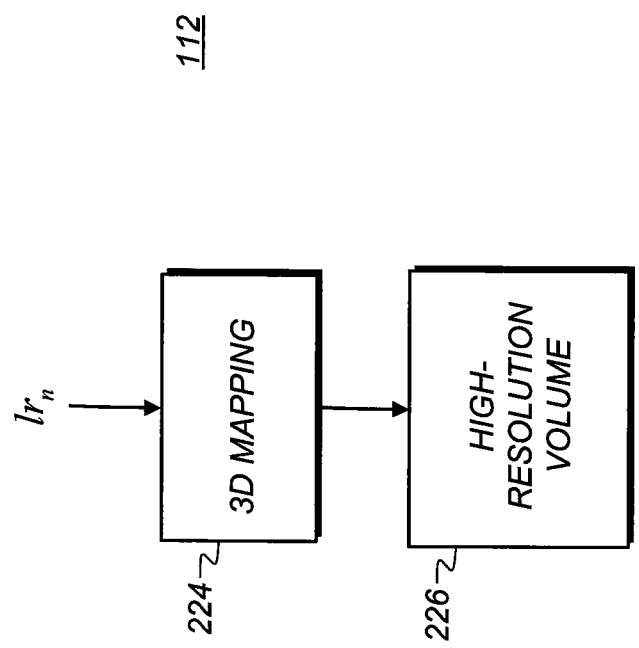

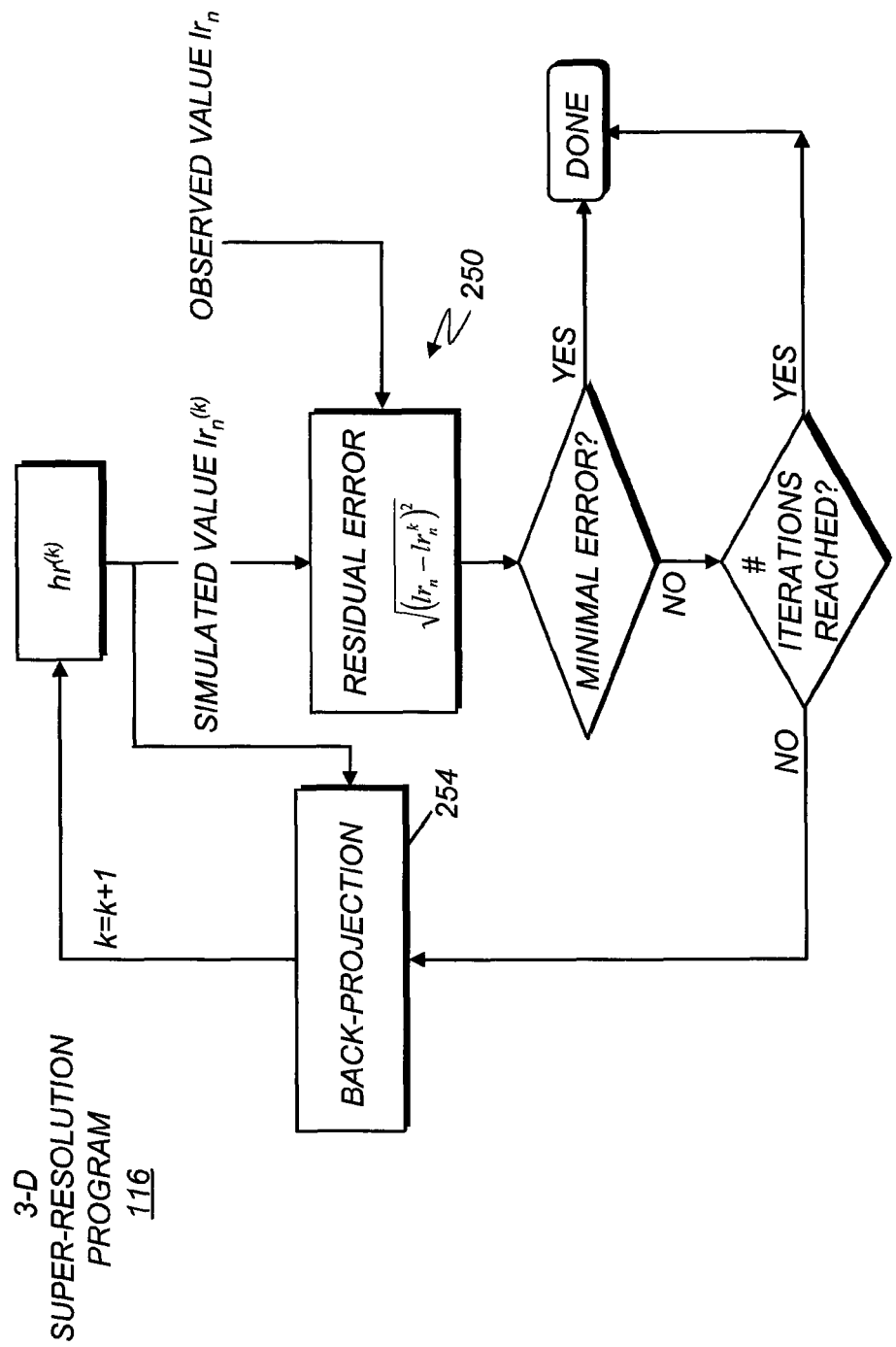

METHOD FOR ENHANCED VOXEL RESOLUTION IN MRI IMAGE

CROSS REFERENCE TO RELATED APPLICATION

Reference is made to and priority claimed from U.S. Provisional Application Ser. No. 61/033,551 filed Mar. 4, 2008, entitled MODEL-BASED SUPER-RESOLUTION FOR MRI, incorporated herein by reference.

FIELD OF THE INVENTION

The present invention relates generally to diagnostic imaging and more particularly relates to methods for enhancing three-dimensional image resolution for volume-imaging apparatus.

BACKGROUND OF THE INVENTION

MRI (magnetic resonance imaging) is a noninvasive method for imaging that produces images of the anatomy and the functional condition of the human body. An MRI scanner is capable of acquiring two-dimensional (2-D) sectional images (slices) of the human body from any orientation. Unlike other diagnostic imaging methods, MRI does not use ionizing radiation. Instead, MRI operates with signals in the radio-frequency (RF) range; MR signals used for generating image slices come from the body itself.

MR images are rich in information. MR image characteristics are intrinsically related to operator-specific parameters, termed MRI protocols, and tissue properties, including the proton density $\delta$, spin-lattice relaxation time T1, the spin-spin relaxation time T2, molecular motions such as diffusion and perfusion, susceptibility, and chemical shift differences.

The MR image is stored and presented as an array of voxels, that is, as volume pixel data. With voxel data, image data values can be represented in three-dimensional space. This feature offers enhanced opportunities for improved visualization and display and can be particularly advantageous to a diagnostician in examining images of the internal anatomy of a patient.

Although there may be advantages when compared against other imaging techniques, MRI provides a relatively limited image resolution. Currently, in-plane MRI slice resolution is higher than out-of-plane resolution, with the former being fundamentally limited by the Fourier pixel size and the latter limited by the available gradient strength and the allowable pulse length. Typical in-plane resolution for a clinical MR image is in the range of 350 microns. Out-of-plane resolution is typically 14 times lower (coarser), in the range of about 4 mm.

In general, spatial resolution of an imaging system is related to its point spread function (PSF). For example, two point sources are resolvable in the resultant image only when the separation between them is larger than the width at the half maximum of the PSF. Symbolically, this is the convolution expressed by $$\hat{I}(x)=I(x)*h(x), \tag{1}$$

which describes an elegant mathematical relationship between an object function $I(x)$, its image $\hat{I}(x)$, and the PSF function $h(x)$.

Improvements to MR image resolution are desirable. However, increasing voxel resolution in MR images using existing image acquisition methods has proved to be particularly challenging. Adapting conventional imaging techniques to obtain full scans in three dimensions can be very time consuming, thus significantly extending acquisition times.

Super-resolution (SR) techniques for improving MRI resolution have attracted attention from researchers in diagnostic imaging fields. However, the adaptation of such techniques is not straightforward and conventional approaches to increasing resolution have thus far have generally proved unsatisfactory. SR methods based on Fourier Transform theory and the frequency domain, for example, do not appear to handle image blurring or alignment particularly well. Existing techniques are sensitive to partial volume effects (PVEs) that result from limited spatial resolution. PVEs obscure 3-D renderings and compromise clear depiction of tissue boundaries, especially when these boundaries are oriented parallel to the acquisition plane. Other conventional approaches, such as the method described in U.S. Pat. No. 6,998,841 entitled "Method and System which Forms an Isotropic, High-Resolution, Three-Dimensional Diagnostic Image of a Subject from Two-Dimensional Image Data Scans" to Tamez-Pena et al. require that the different images that are combined or fused to form an enhanced 3-D image need to be substantially orthogonal with respect to each other, which places some constraints on imaging techniques and limits the usability of the SR algorithms.

Thus, it can be seen that although there have been a number of proposed approaches for improving the voxel resolution of MRI images, there remains room for improvement in image processing techniques.

SUMMARY OF THE INVENTION

It is an object of the present invention to advance the art of MR imaging and image presentation. With this object in mind, the present invention provides a method for providing an enhanced 3-D image for a volume imaging apparatus comprising: a) obtaining a plurality of 3-D volume images of an object at a first resolution, wherein at least two of the images are obtained at different spatial orientations; b) forming a 3-D matrix of voxels at a second resolution, higher than the first resolution, by iterations of steps in the following sequence: (i) registering two or more of the 3-D volume images that have different spatial orientations and that intersect at the voxel; (ii) mapping the voxel to the 3-D matrix at the second resolution; (iii) executing an inpainting routine that fills in gap regions between mapped voxels in the 3-D matrix; (iv) generating a simulated first-resolution data value according to one or more 3-D matrix voxel values at the second resolution; (v) comparing the simulated first-resolution data value with an observed first-resolution value from the plurality of 3-D volume images and, until the simulated first resolution data value is within a predetermined threshold value of the observed first-resolution value or until a predetermined number of iterations is reached, adjusting the 3-D matrix voxel values at the second resolution and recomputing the simulated first-resolution data value from (iv); and c) storing the 3-D matrix voxel values at the second resolution as the enhanced 3-D image.

It is a feature of the present invention that it employs DICOM-related information for obtaining suitable alignment of voxel data. Another feature is the use of three-dimensional modeling methods for generating a high-resolution 3-D matrix from actual low-resolution voxel data and stored physical acquisition information. A further feature is the use of three-dimensional inpainting methods for generating data content in high resolution areas of the image. Still further, it is a feature of the present invention that it employs iterative 3-D super-resolution methods for generating an enhanced high-resolution volume.

It is an advantage of the present invention that it does not require orthogonality of the separate images obtained to provide voxel data.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

The foregoing and other objects, features, and advantages of the invention will be apparent from the following more particular description of the embodiments of the invention, as illustrated in the accompanying drawings. The elements of the drawings are not necessarily to scale relative to each other.

FIG. 4 is a logic flow diagram showing a sequence of steps for a 3-D modeling method.

FIG. 6A is a logic flow diagram showing an iterative method used for obtaining a super-resolution 3-D image in one embodiment.

DETAILED DESCRIPTION OF THE INVENTION

Figure 1:
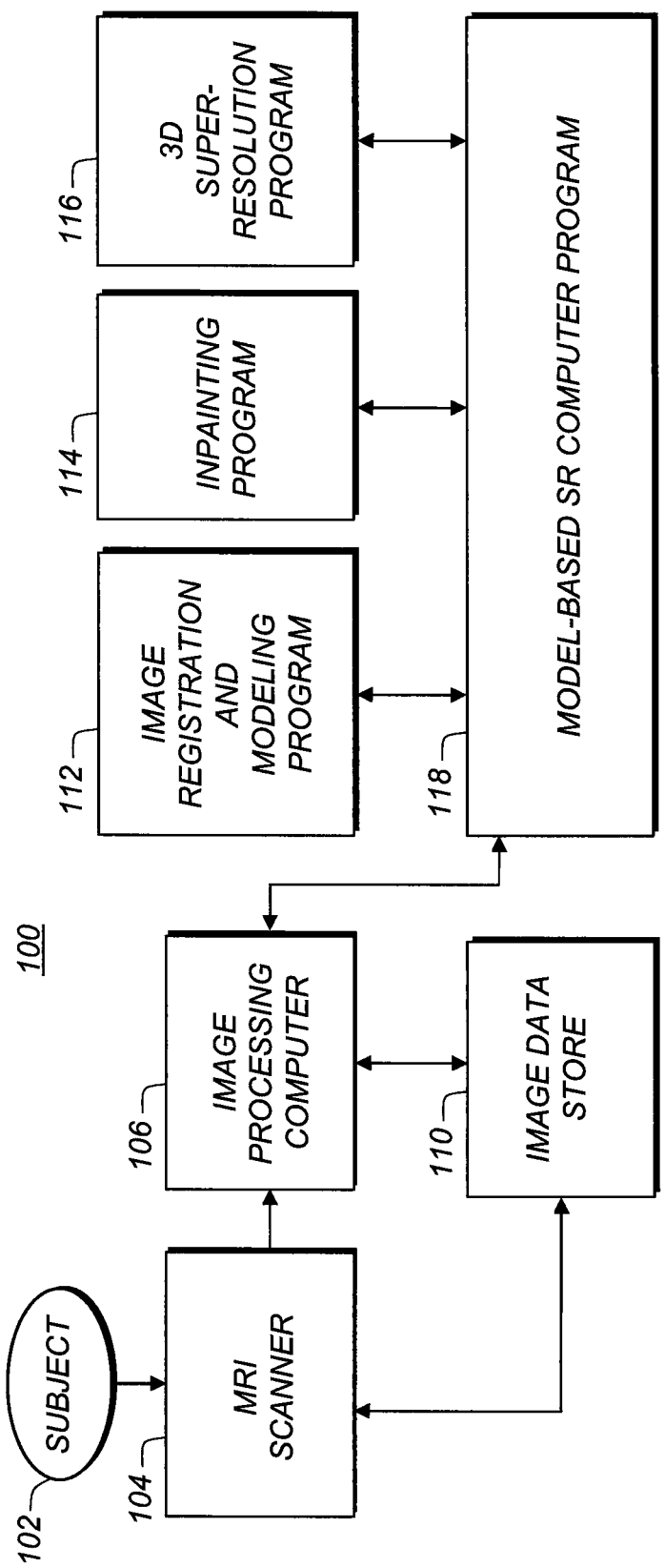
FIG. 1 is a schematic diagram showing components of an image acquisition and processing system for executing the method of the present invention in one embodiment.

The following is a detailed description of the preferred embodiments of the invention, reference being made to the drawings in which the same reference numerals identify the same elements of structure in each of the several figures.

FIG. 1 shows components of an image acquisition and processing system 100 for executing the method of the present invention in one embodiment. Image acquisition and processing system 100 includes a magnetic resonance imaging (MRI) scanner 104, that images a subject 102, such as a patient, to produce a volume of image data as a sequence of individual image slices. The entire set of image slices provides volume image data for the subject. The number of slices taken from one direction may vary from a few dozen to hundreds of image slices, limited by the current MRI scanner resolution. The image slices are conventionally stored in an image data store 110 as a DICOM series, as reported in National Electrical Manufacturers Association (NEMA) ed.: *Digital Imaging and Communications in Medicine (DICOM)* Part 3, PS 3.3 (2003). These DICOM series can be referred to as pre-processed image data.

Post-processing of image data can take any of a number of forms. In one embodiment, an image processing computer 106 uses the DICOM series stored in image data store 110 to produce highly spatial- and contrast-resolved MR volume data. In the embodiment of FIG. 1, a model-based super-resolution (SR) computer program 118 uses logic from an image registration and data modeling program 112, along with an inpainting program 114 and a 3-D SR program 116 for providing SR image output.

Figure 2:
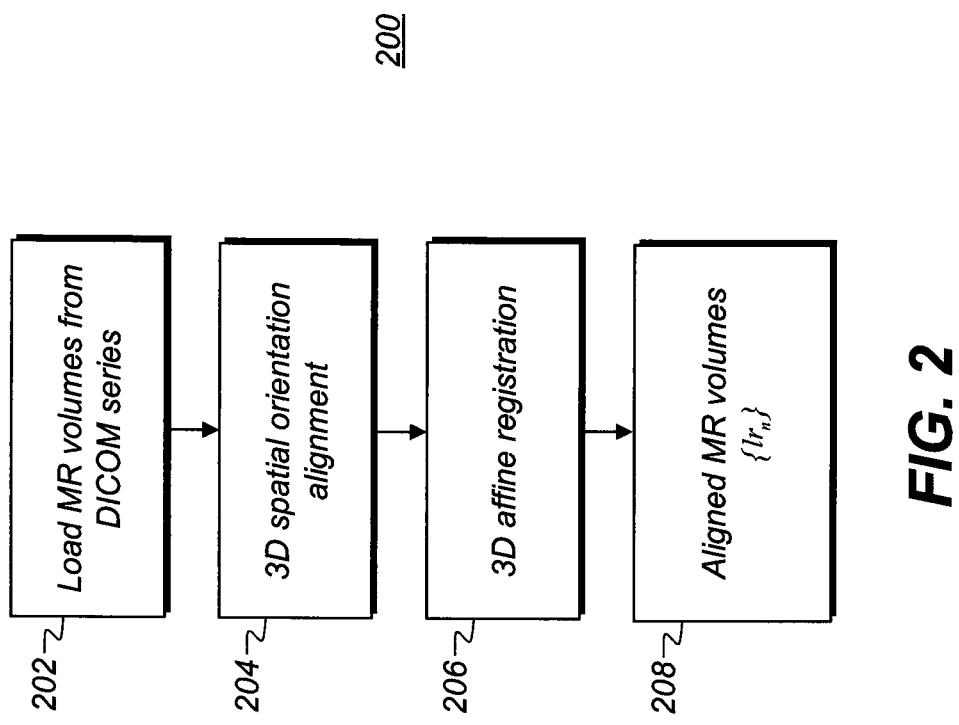
FIG. 2 shows an example flowchart for an image registration process according to one embodiment.

FIG. 2 illustrates an example flowchart for an image registration process 200 that aligns individual DICOM series from a MR study of a patient onto a common coordinate system. Initially, the DICOM series for a subject is loaded at a load step 202. In a 3-D spatial orientation alignment step 204, each series is then aligned using a 4×4 DICOM spatial orientation matrix that maps the three-dimensional (3-D) volume onto a common patient coordinate system. In the preferred embodiment, this transformation matrix is defined in terms of the position of a patient, according to DICOM imaging standards. DICOM stores two direction cosines for the first two dimensions in the Image Orientation (Patient) (0020, 0039) tag. The next dimension is defined as the cross product of the first two. For example, given three direction cosines $\phi_1$, $\phi_2$, $\phi_3$ and the Image Position (Patient) (0020, 0032) P, the 4×4 DICOM spatial orientation matrix is as follows:

$$DICOM \text{ spatial orientation matrix} = \begin{bmatrix} \phi_1[0] & \phi_2[0] & \phi_3[0] & P[0] \\ \phi_1[1] & \phi_2[0] & \phi_3[0] & P[1] \\ \phi_1[2] & \phi_2[0] & \phi_3[0] & p[2] \\ 0 & 0 & 0 & 1 \end{bmatrix}. \quad (2)$$

3-D spatial orientation alignment step 204 corrects for the 3-D volume spatial orientation using a transformation, such as the matrix given in (2) provides. Then, in an affine registration step 206, a robust, iterative, intensity-based 3-D affine registration is carried out to correct residual misalignment among the volumes. 3-D affine registration accounts for translation, rotation, scale, and shear differences. The 3-D affine registration is performed in a coarse-to-fine resolution manner in one embodiment. The image registration process 200 then ends at a step 208, providing aligned low-resolution volumes $\{lr_n\}$ as output.

In one embodiment, affine registration uses linear interpolation and a mutual information (MI) similarity function to optimize the affine transformation parameters, as disclosed in F. Maes, A. Collignon, D. Vandermeulen, G. Marchal and P. Suetens, "Multimodality image registration by maximization of mutual information" *IEEE Transactions on Medical Imaging* 16 2 (1997), pp. 187-198, and in W. M. Wells, III, P. Viola, H. Atsumi, S. Nakajima and R. Kikinis, "Multimodal volume registration by maximization of mutual information" *Medical Image Analysis* 11 (1996), pp. 35-51. An optimization process is carried out by using the Powell's method to find a set of up to 12 parameters (3 translations, 3 rotations, 3 scales, 3 shears) that maximize the MI of the joint probability distribution of two volumes. A faster affine registration is achieved by taking into account only voxels within a volume of interest (VOI) (e.g., foreground region of the knee MR volume) in a coarse-to-fine resolution manner.

The present invention provides a modeling program 112 that maps the actual acquired voxel intensity values onto a higher-resolution 3-D array. This takes into account slice thickness and the spacing between the slices, using data that is stored in DICOM tags: Slice Thickness (0018, 0050) and Spacing Between Slices (0018, 0088), respectively, when mapping these low-resolution voxels intensities onto a high-resolution, isotropic 3-D array. Previous SR methods have not considered this important physical acquisition information and have relied, instead, on specialized acquisition techniques, such as small-shifted acquisitions, as published by S. Peled and Y. Yeshurun in "Superesolution in MRI-perhaps sometimes," *Magnetic Resonance in Medicine*, Vol. 48, 2002, pp 409.

Figure 3A:
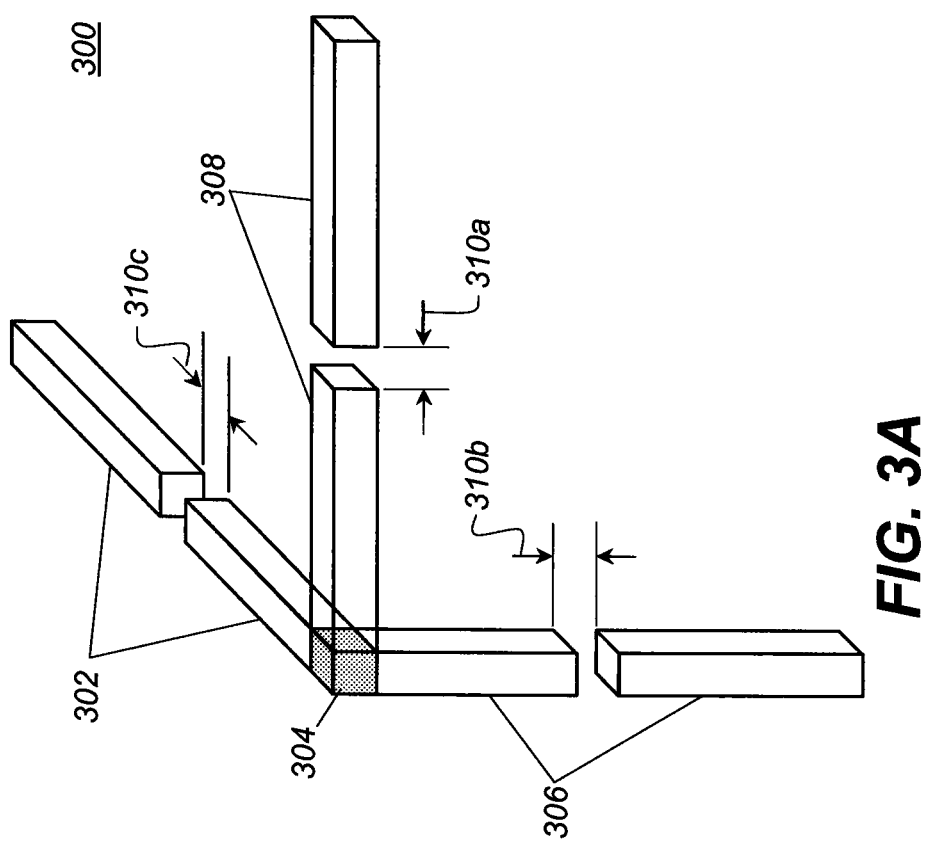
FIG. 3A is a perspective diagram showing geometry for obtaining a 3-dimensional view of MRI data.

FIG. 3A illustrates an exemplary 3-D geometric relationship 300 for six low-resolution MRI voxels 302, 306, 308, in three pairs that are orthogonally oriented with respect to one another (e.g. axially, coronally, and sagittally). 3-D gaps 310$a$, 310$b$, and 310$c$ between the respective voxels define 3-D spatial locations where the intensity values are unknown. The width $\delta_n$ of the 3-D gap for any given $\{lr_n\}$, n= 1, 2, 3, . . . is expressed by:

$$\delta_n = (\text{slice spacing}_n) - (\text{slice thickness}_n). \quad (3)$$

Figure 3B:
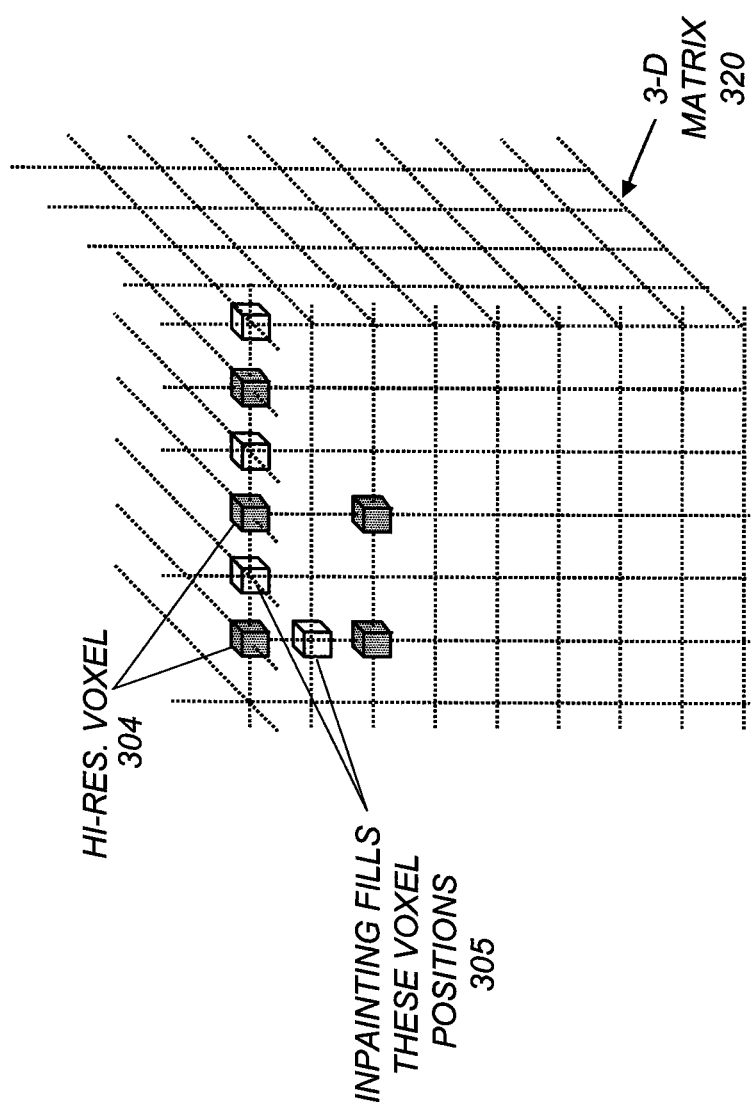
FIG. 3B is a perspective diagram showing voxels and inpainting in a 3-D matrix of MRI data.

In FIG. 3A, a shaded isotropic cube highlights a high-resolution voxel 304 to be estimated from the data values of three neighboring, intersecting, and low-resolution voxels obtained at different orientations. Advantageously, methods of the present invention handle input volumes acquired in any arbitrary orientation since a robust image registration process 200 (described earlier with reference to FIG. 2) precedes this 3-D modeling method step. FIG. 3B shows mapping of high-resolution voxels 304 to a high-resolution 3-D matrix 320. As shown in FIG. 3B, high-resolution voxels 304 typically do not fully populate high-resolution 3-D matrix 320. Inpainting program 114 (FIG. 1) is used to fill intermediate positions at voxels 305, as described subsequently. Thus, within this volume, a 3-D array of high-resolution voxels 304 and 305 is distributed.

FIG. 4 shows how the modeling program that obtains the 3-D matrix 320 arrangement of FIG. 3B works. The input is the set of observed low-resolution volumes $\{lr_n\}$ that are mapped onto 3-D high-resolution matrix 320 at a mapping step 224. In one embodiment, the intensity value of a high-resolution voxel at a specific 3-D spatial location is a result of a linear combination of all low-resolution voxels mapped to or intersecting that spatial location. It should be noted that other interpolation schemes, including more complex techniques, may be used as well, without departing from the spirit of the invention. The program terminates at a high-resolution volume step 226, providing a high-resolution volume, 3-D matrix 320, as output.

Once the true voxel intensity values are mapped onto higher resolution 3-D matrix 320, there are gaps between identified points, as described earlier with reference to FIG. 3B. Embodiments of the present invention apply a fast 3-D inpainting algorithm to recover missing intensity values from voxels 305 that are located within the 3-D gap regions.

2-D inpainting is a tool, familiar to those skilled in the photographic imaging arts, that diffuses color or intensity values into damaged or missing portions of a 2-D image. In embodiments of the present invention, a fast 3-D inpainting program 114 (FIG. 1) fills in 3-D gap regions by iteratively diffusing the intensity values of the surrounding neighboring voxels into the 3-D gap regions. Unlike conventional 2-D inpainting approaches, however, the inpainting process of the present invention controls diffusion flow by taking into account the 3-D blurring direction of the data (i.e., its 3-D point spread function (PSF)). The 3-D inpainting method of the present invention does this by using 3-D directional Gaussian functions with the value of full-width at half maximum (FWHM) set to equal the width $\delta_n$ of the 3-D gaps between voxels, shown as gaps 310$a$, 310$b$, and 310$c$ in FIG. 3A. This avoids blurring edges and promotes boundary continuity, and appears to be better suited to 3-D imaging than are conventional 2-D inpainting approaches.

Figure 5:
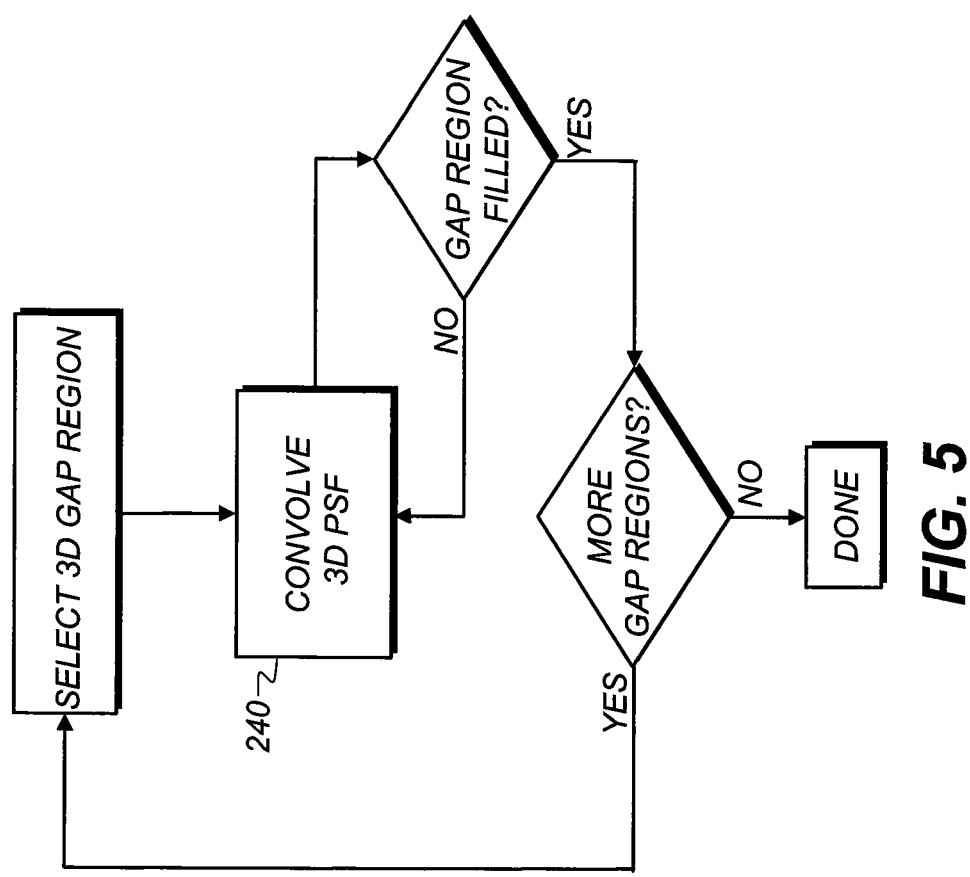
FIG. 5 is a logic flow diagram showing the 3-D inpainting method.

FIG. 5 shows how the 3-D inpainting program 114 works according to one embodiment. In this processing, each 3-D gap region is filled in at step 240 by iteratively convolving 3-D directional Gaussian functions. This process is itself repeated iteratively until each individual 3-D gap region is filled, in turn, and terminates when all 3-D gap regions are filled. The output of program 114, then, is an initial guess for the high-resolution volume, shown as pixel 305 in FIG. 3B.

Referring back to FIG. 1, 3-D SR program 116 employs an iterative method for 3-D SR imaging using a back-projection technique. By way of illustration, iterative SR imaging for the reduced complexity of 2-D imaging using back projection is described by M. Irani and S. Peleg in "Improving Resolution by Image Registration," *Graphical Models and Image Processing*, Vol. 53, 1991, pp 231-239. The 3-D imaging problem addressed by the method of the present invention is more complex, however. 3-D volume images must be obtained and their DICOM data analyzed in order to identify data obtained from the same 3-D voxel and to determine the direction required for point-spread function considerations.

Figure 6B:
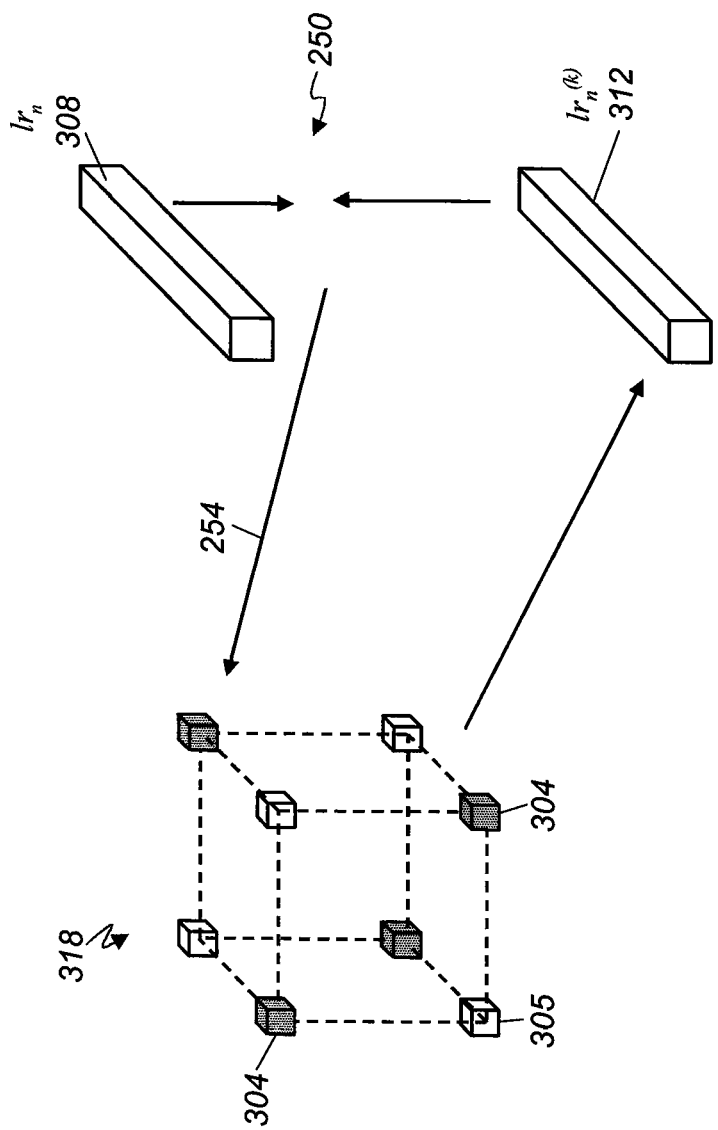
FIG. 6B is a schematic diagram showing processing performed using the SR processing method of FIG. 6A.

FIGS. 6A and 6B show how iterative 3-D SR program 116 works in both logic flow and functional terms. Inputs to this iterative algorithm are:

(1) an initial guess for the high-resolution volume $\{hr^{(k)}, k=0\}$ (where k is the iteration number), and (2) the observed low-resolution volumes $\{lr_n\}$.

Simulated low-resolution volumes $\{lr_n^{(k)}\}$ are first computed by using the current $\{hr^{(k)}\}$. Ideally, at a given k-th iteration, the values assigned to $\{lr_n^{(k)}\}$ and their corresponding actual or observed values $\{lr_n\}$ are identical when a perfect, high-resolution volume is reconstructed.

In practice, the algorithm shown in FIG. 6A minimizes the residual error of the intensity values $\{\sqrt{(lr_n - lr_n^k)^2}\}$ computed and checked at a residual error evaluation step 250 by combining these residual errors values with the current guess $\{hr^{(k)}\}$ at a back-projection step 254, so that an updated high-resolution volume $\{hr^{(k)}, k=k+1\}$ is generated. In one embodiment, for example, residual errors are added back to values $hr^{(k)}$. This process is repeated iteratively for a predetermined number of iterations or until the residual error is within a predetermined threshold.

FIG. 6B shows how the high-resolution matrix computation works in schematic form. A portion 318 of the 3-D matrix, with a number of voxels 304 and 305, is used to generate a simulated low-resolution volume data value $lr_n^{(k)}$, shown as simulated data value 312. This is compared with an observed low-resolution value $lr_n$ 308 in evaluation step 250. The results of the comparison are used to recompute and adjust values in the portion 318 of the high-resolution matrix in back projection step 254.

Figure 7:
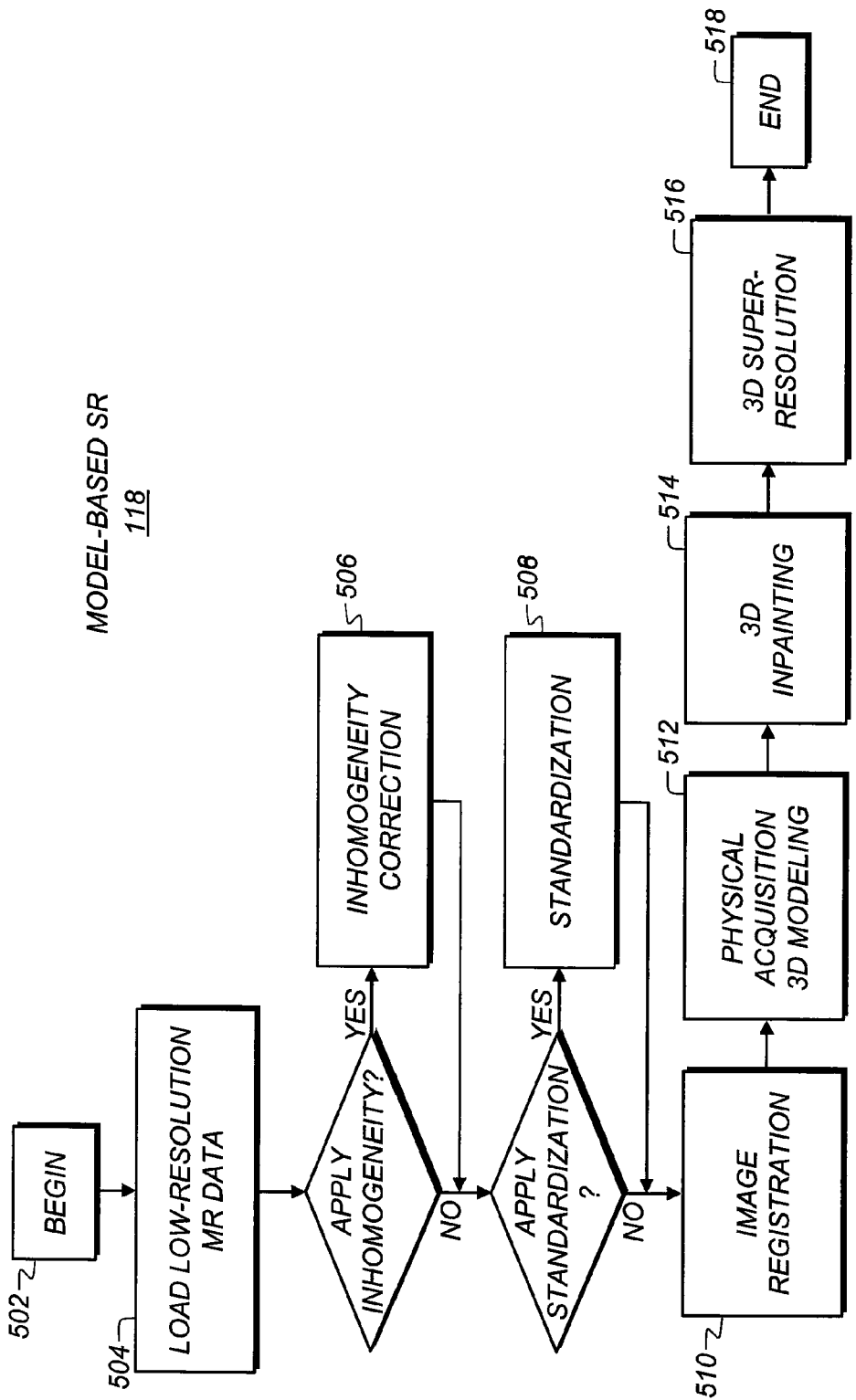
FIG. 7 is a logic flow diagram for the super-resolution process according to one embodiment.

Referring again to FIG. 1, model-based SR program 118 is executed along with inpainting step 114 and image registration step 112. FIG. 7 shows an example flow diagram for the model-based SR program 118. The method begins at an initialization step 502. As part of initialization, an object is imaged such that a set of digital images is produced. Each digital image is an imaged slice of the object. The set of digital images is, then, a set of image slices representing the object.

In one embodiment, the object is an anatomical structure, and the slices are individual images taken using magnetic resonance imaging.

Continuing with the process of FIG. 7, low-resolution volumes $\{lr_n\}$ of medical image data are acquired at a loading step 504 as a sequence of individual image slices. These $\{lr_n\}$ volumes can be at orthogonal angles or at other arbitrary angles in relation to each other. Subsequent pre-processing steps, inhomogeneity correction step 506 and standardization step 508 are optional. MR datasets from a patient, particularly, when these datasets come from different MR studies or from a different scanner, can benefit significantly from applying inhomogeneity correction at step 506 and intensity standardization processing at standardization step 508. At a registration step 510, image registration for $\{lr_n\}$ is performed; then, at a modeling step 512 a 3-D modeling method maps the actual acquired voxel intensity values onto a high-resolution, isotropic 3-D array. This takes into account slice thickness and the spacing between the slices, stored in DICOM tags, as described previously.

Due to physical acquisition parameters, 3-D gap regions between acquired slices may be present, so that image intensity values within these regions are missing. The present invention recovers missing intensity values by applying a fast 3-D inpainting method that initially produces a first guess for the high-resolution dataset $\{hr^{(k)}, k=0\}$ at inpainting step 514, as was described earlier with reference to FIG. 5. Given $\{lr_n\}$ and $\{hr^{(k)}, k=0\}$, a fully iterative 3-D super-resolution implementation is then applied for reconstructing, in a 3-D SR step 516, a high-resolution volume $\{hr^{(k)}, k=k+1\}$ that better corresponds to the given original low-resolution datasets $\{lr_n\}$ as shown in FIGS. 6A and 6B. Program 118 (FIG. 7) ends at a finalization step 518 with the output of a reconstructed high-resolution volume.

Application of the present invention was conducted using clinical 1.5T knee MRI datasets (Sigma EXCITE, GE Healthcare). MRI sequences include sagittal PD spin-echo (SE) and T2 fat-saturated fast spin-echo (FSE); coronal and axial T1 SE and T2 fat-saturated FSE, with a volume size of 512×512×24, and voxel size (0.3125×0.3125×4.5) mm³. Slice thickness is 4.0 mm and the spacing between slices is 4.5 mm, so δ=0.5 mm. After applying the model-based SR algorithm of the present invention, the output high-resolution data size is 512×512×348, with voxel size equal to a 0.3125 mm isotropic cube.

Qualitative Evaluation

Figure 8A:
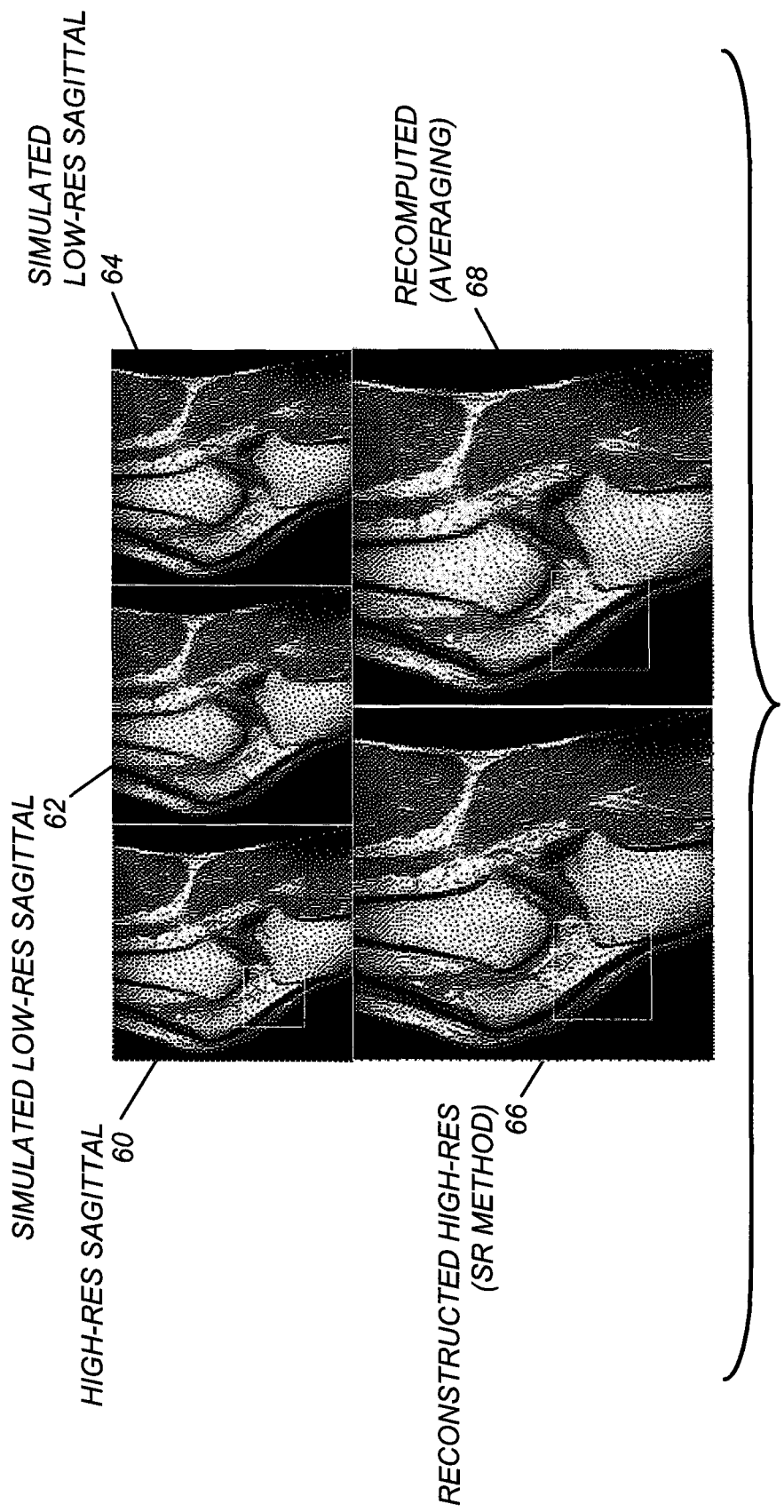
FIGS. 8A and 8B show a series of images comparing processing results for the method of the present invention with a simple 2-D averaging of the input images.
Figure 8B:
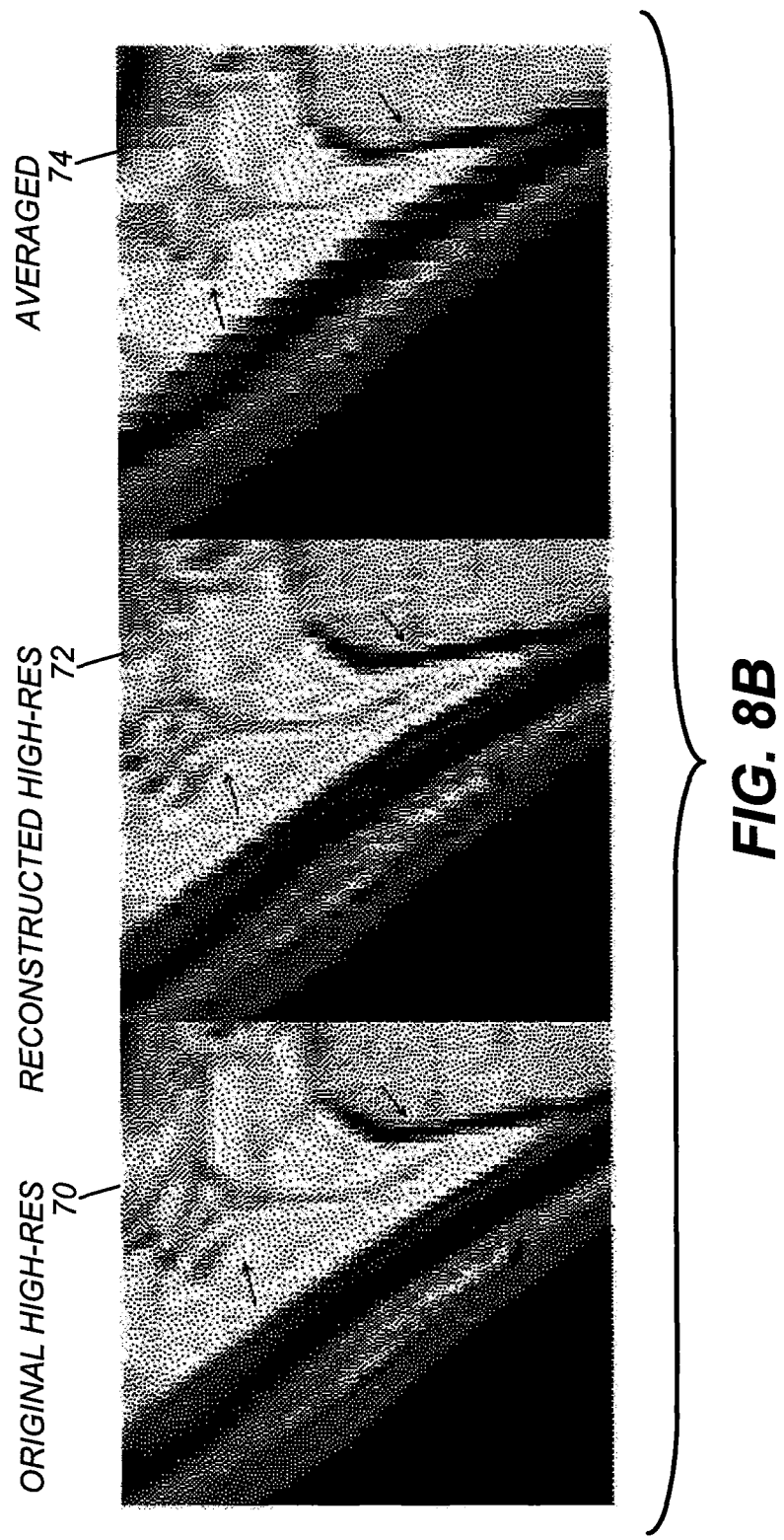

FIGS. 8A and 8B show results of a qualitative experiment in generating and using 2-D synthetic data. In FIG. 8A, two low-resolution sagittal slices 62 and 64 are simulated from an original high-resolution sagittal T1 slice 60 ((a) top left) so that they resemble low-resolution sagittal slices coming from a coronal and an axial MRI acquisition ((a) top middle and right, respectively). These two simulated slices 62 and 64 are then used to reconstruct a high-resolution slice.

The lower row of images in FIG. 8A shows a reconstructed high-resolution slice 66 using the super-resolution method of the present invention and a recomputed slice 68 formed by averaging the two low-resolution sagittal slices 62 and 64 just described. In FIG. 8B, a magnified view 70 shows a portion of the original high-resolution slice 60. A magnified view 72 then shows a portion of reconstructed high-resolution slice 66. A magnified view 74 shows an averaged recomputed slice 68. Comparing magnified views 70, 72, and 74, it is instructive to note how the details and edges (indicated using black arrows) are more clearly recovered by the model-based SR method of an embodiment of the present invention (in view 72), than by the simple 2-D averaging from the low-resolution slices (in view 74).

Figure 9:
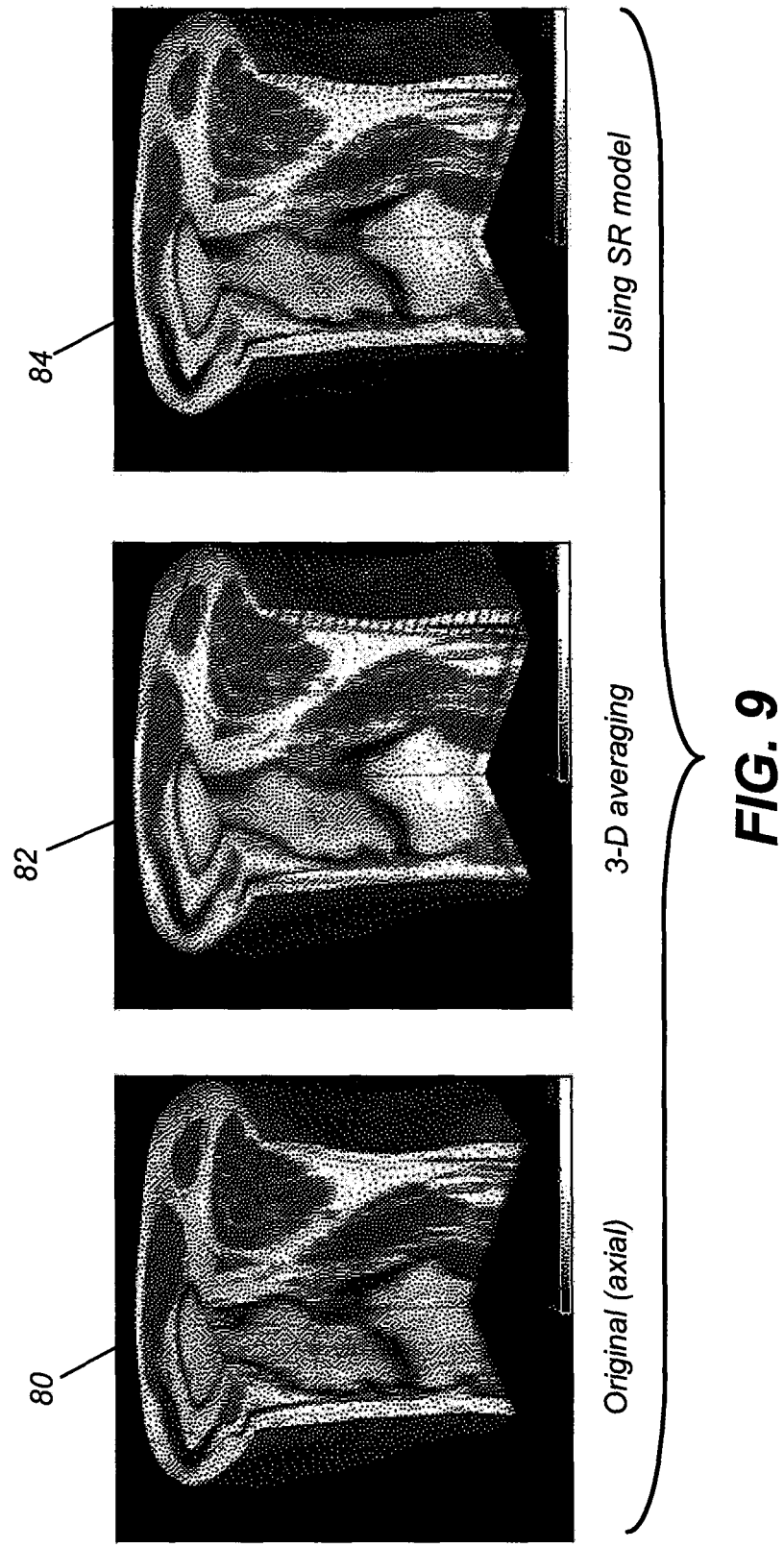
FIG. 9 shows rendered results for original, averaged, and super-resolution rendering.

FIG. 9 shows rendering results for three 3-D images formed using clinical T1 and T2 knee MRI data. An image 80 shows rendering results for an original axial low-resolution dataset. An image 82 shows rendering after a simple 3-D averaging approach that performs linear interpolation and computes the mean intensity values from the input low-resolution voxels onto a higher resolution 3-D array. An image 84 then shows rendering after applying the proposed model-based SR framework of the present invention to the same set of acquired volumes. The 3-D rendition from the high-resolution dataset that was generated by the SR method of the present invention reveals a much richer, sharper, and more vivid 3-D anatomy of the knee, capable of depicting smaller and thinner structures (e.g., ligaments, cartilage, tendons, and the meniscus) clearly in all three directions.

Quantitative Evaluation

For a quantitative evaluation, the model-based SR method is compared with a simple 2-D averaging approach that performs linear interpolation and computes the mean intensity values from neighboring input low-resolution voxels onto a higher resolution 2-D array. A synthetic low-resolution sagittal slice corresponding to (1) four slice thicknesses (1, 2, 3, and 4 mm), and (2) 10 gap values δ varying from 0.1 to 1 mm were used in this experiment.

Figure 10:
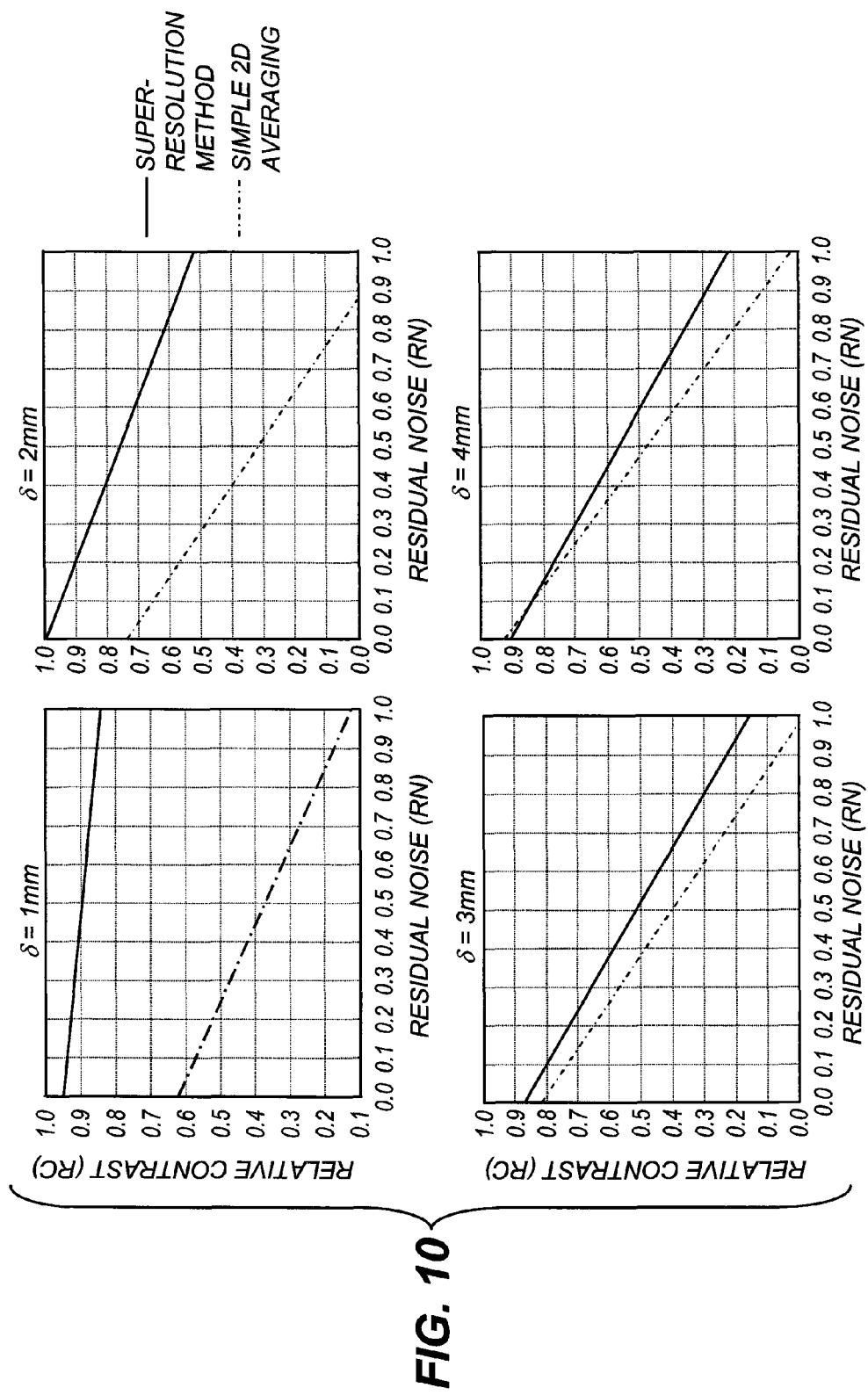
FIG. 10 shows quantitative comparison of the method of the present invention against conventional averaging for different gap distances between slices.

Residual noise (RN) in the reconstructed slice is defined as the standard deviation $\sigma_i$ of voxel intensities within some large (and relatively homogeneous) bone regions i. Similarly, relative contrast (RC) of these bone regions is defined as:

$$RC = \frac{|M_i - M_i^{IE}|}{\sqrt{\sigma_i \sigma_i^{IE}}} \quad (4)$$

where $M_i$ and $\sigma_i$ denote the mean and standard deviation, respectively, of voxel intensities within the trabecular bone regions. Values $M_i^{IE}$ and $\sigma_i^{IE}$ denote similar entities outside the trabecular bone region in their immediate exterior (i.e., a set of all voxels in the cortical bone, which are six-adjacent to some voxels in the trabecular bone). FIG. 10 demonstrates the behavior of each method by plotting how RN and RC values vary as a function of δ for the four different slice thickness values. The value of RN and RC were normalized by their maximum observed in these experiments.

In assessing SR method performance, it is challenging to increase/maintain relative contrast RC when residual noise RN increases at the same time. The upper-left corner in any of the graphs in FIG. 10 represents the ideal RC (highest possible contrast) at the least residual noise. Since relative contrast RC monotonically decreases as residual noise RN increases for both methods, the area under the curve (AUC) is, therefore, a useful measure of the overall performance of a super-resolution method relative to conventional approaches. A higher value of the AUC for a method indicates its more effective reconstruction. In FIG. 10, for every slice thickness, SR processing of the present invention outperforms the averaging method; the AUC for SR is higher than that for the averaging method. On average, the AUC for SR processing of the present invention measured about 0.7±0.2, whereas for conventional averaging, the AUC measured was much lower, at about 0.4±0.1.

On a quad-core (2.66 GHz and 2 GB RAM) PC, 3-D inpainting requires less than five iterations to converge and complete and takes only about 12 sec per iteration for a 512×512×348 volume size. By contrast, conventional Field-of-Experts (FoE)-based inpainting requires thousands of iterations and takes about 112 sec per iteration. The 3-D super-resolution method of the present invention performs about as quickly as does 3-D inpainting; on average, processing took less than 1 min. per iteration for the same volume size. In practice, a single iteration was sufficient for a smaller dataset.

The various techniques described herein may be implemented in connection with hardware or software or, where appropriate, with a combination of both. Thus, the methods and apparatus of the invention, or certain aspects or portions thereof, may take the form of program code (i.e., instructions) embodied in tangible media, such as magnetic or optical storage media, hard drives, portable memory devices, or any other machine-readable storage medium. When the program code is loaded into and executed by a machine, such as a computer, the machine becomes an apparatus for practicing the invention.

While aspects of the present invention have been described in connection with the preferred embodiments and with respect to various figures, it is to be understood that other similar embodiments may be adapted, or modifications and additions made, to the described embodiment for performing the same function of the present invention without departing from the scope of the present invention. Furthermore, it should be emphasized that a variety of computer platforms are contemplated, including handheld device operating systems and other application specific operating systems, especially as the number of wireless networked devices continues to proliferate. Therefore, the claimed invention is not limited to any single embodiment, but rather should be construed in breadth and scope in accordance with the appended claims.

PARTS LIST 60, 62, 64 Slice
66 Slice
68 Slice
70, 72, 74 Magnified view
80, 82, 84 Image
100 Image acquisition and processing system
102 Subject
104 Scanner
106 Computer
110 Data store
112 Modeling program
114 Inpainting program
116 Super-resolution program
118 Model-based SR program
200 Image registration process
202 Load step
204 3-D spatial orientation alignment step
206 3-D affine registration step
208 Output step
224 3-D modeling step
226 Output step
240 Loop
250 Residual error evaluation step
254 Back-projection step
300 3-D geometric relationship
302, 304, 306, 308 Low-resolution voxel
304, 305 Voxel
308 Observed low-resolution value $lr_n$
310a, 310b, 310c Gap
312 Simulated data value
318 Portion of 3-D matrix
320 3-D matrix
502 Initialization step
504 Loading step
506 Inhomogeneity correction step
508 Standardization Step
510 Registration Step
512 Modeling Step
514 Inpainting Step
516 Super-resolution Step
518 Finalization step

The invention claimed is:

1. A method for providing an enhanced 3-D image for a volume imaging apparatus comprising:
   a) obtaining a plurality of 3-D volume images of an object, the images having voxels at a first resolution, wherein at least two of the images are obtained at different spatial orientations;
   b) forming a 3-D matrix of voxels at a second resolution, higher than the first resolution, by iterations of 3-D modeling steps in the following sequence:
      (i) registering two or more of the 3-D volume images that have different spatial orientations at the first resolution;
      (ii) mapping the voxels at the first resolution onto the 3-D matrix;
      (iii) executing a 3-D inpainting routine at the second resolution that iteratively convolves one or more 3-D directional Gaussian functions in order to fill in gap regions between mapped voxels in the 3-D matrix;
      (iv) generating, by 3-D modeling, simulated first-resolution data values according to one or more 3-D matrix voxel values at the second resolution; and
      (v) comparing the simulated first-resolution data values in each obtained spatial orientation with corresponding observed first-resolution data values from the plurality of 3-D volume images from the same obtained spatial orientation; and, until the simulated first resolution data values are within a predetermined threshold value of the observed first-resolution data value or until a predetermined number of iterations is reached, evaluating a residual error of the simulated and observed data values and minimizing the residual error by combining the residual error with the 3-D matrix voxel values at the second resolution and recomputing the simulated first-resolution data value from (iv); and
   c) storing the 3-D matrix voxel values at the second resolution as the enhanced 3-D image.

2. The method of claim 1 wherein at least two of the 3-D volume images are obtained at relatively orthogonal spatial orientations.

3. The method of claim 1 further comprising correcting for inhomogeneity in one or more of the obtained 3-D volume images.

4. The method of claim 1 further comprising applying image standardization to one or more of the obtained 3-D volume images.

5. The method of claim 1 wherein registering two or more of the 3-D volume images comprises using DICOM data related to image orientation.

6. The method of claim 1 wherein registering two or more of the 3-D volume images comprises using intensity-based 3-D affine registration.

7. The method of claim 6 wherein the intensity-based 3-D affine registration accounts for translation, rotation, scale, and shear differences.

8. The method of claim 6 wherein the intensity-based 3-D affine registration is performed in a coarse-to-fine resolution manner.

* * * * *